(12) United States Patent
Baek et al.

(10) Patent No.: US 8,115,291 B2
(45) Date of Patent: Feb. 14, 2012

(54) SEMICONDUCTOR PACKAGE

(75) Inventors: Joonghyun Baek, Suwon-si (KR); Sungjun Im, Yongin-si (KR); Heejin Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 279 days.

(21) Appl. No.: 12/461,093

(22) Filed: Jul. 31, 2009

(65) Prior Publication Data
US 2010/0052132 A1 Mar. 4, 2010

(30) Foreign Application Priority Data
Aug. 29, 2008 (KR) .................. 10-2008-0085380

(51) Int. Cl.
*H01L 23/02* (2006.01)
(52) U.S. Cl. .................. 257/686; 257/777; 257/707
(58) Field of Classification Search .................. 257/686, 257/777, 723, 724, 706, 707
See application file for complete search history.

(56) References Cited

U.S. PATENT DOCUMENTS

| | | | |
|---|---|---|---|
| 6,507,115 B1 * | 1/2003 | Hofstee et al. .................. 257/777 |
| 6,737,755 B1 * | 5/2004 | McLellan et al. .................. 257/796 |
| 6,975,020 B2 | 12/2005 | Lee | |
| 7,382,056 B2 * | 6/2008 | Chiu et al. .................. 257/777 |
| 2002/0149102 A1 * | 10/2002 | Hashemi et al. .................. 257/706 |
| 2006/0220227 A1 * | 10/2006 | Marro .................. 257/723 |
| 2007/0176298 A1 * | 8/2007 | Osone et al. .................. 257/777 |
| 2007/0181991 A1 | 8/2007 | Ishino et al. | |

FOREIGN PATENT DOCUMENTS

| | | |
|---|---|---|
| JP | 2007-194444 | 8/2007 |
| KR | 10-0475740 | 3/2005 |
| KR | 10-2007-0038798 | 4/2007 |

OTHER PUBLICATIONS

An English language abstract of Korean Publication No. KR 10-2004-0076361, published Sep. 1, 2004.

* cited by examiner

*Primary Examiner* — Sheila V Clark
(74) *Attorney, Agent, or Firm* — Harness, Dickey & Pierce, P.L.C.

(57) ABSTRACT

Provided is a semiconductor package including a first substrate including a first substrate pad and a second substrate pad spaced apart from each other, first semiconductor chips stacked on the first substrate and having a first side surface and a second side surface, first chip pads disposed on the first substrate pad and adjacent to the first side surface and provided to the respective first semiconductor chips in the peripheral circuit region and electrically connected to the first substrate pad, and a second semiconductor chip disposed toward the second side surface and including a second chip pad spaced apart from the first chip pad and electrically connected to the second substrate pad, and a heat insulation member provided to the first substrate between the at least one first substrate pad and the at least one second substrate pad.

13 Claims, 14 Drawing Sheets

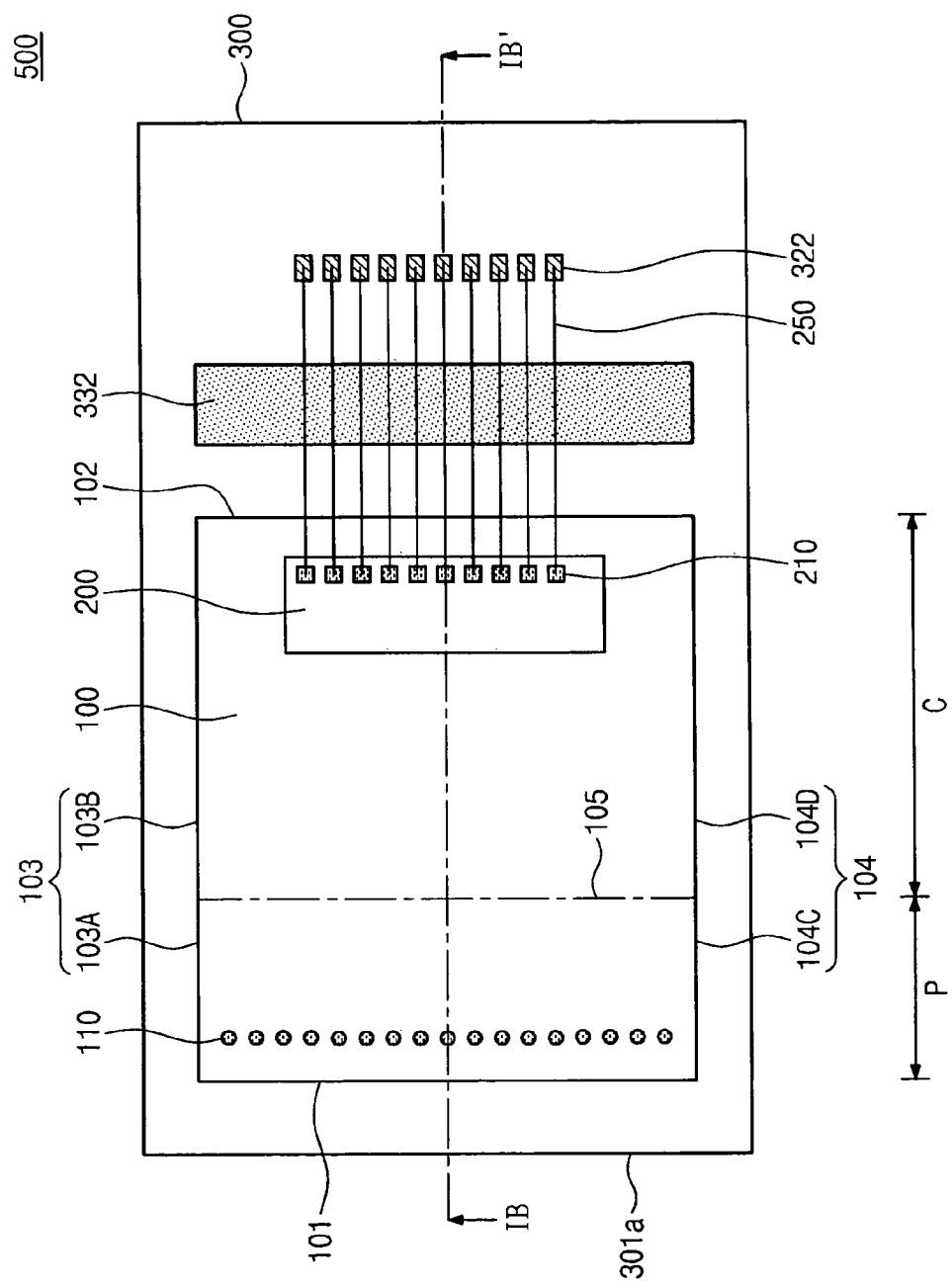

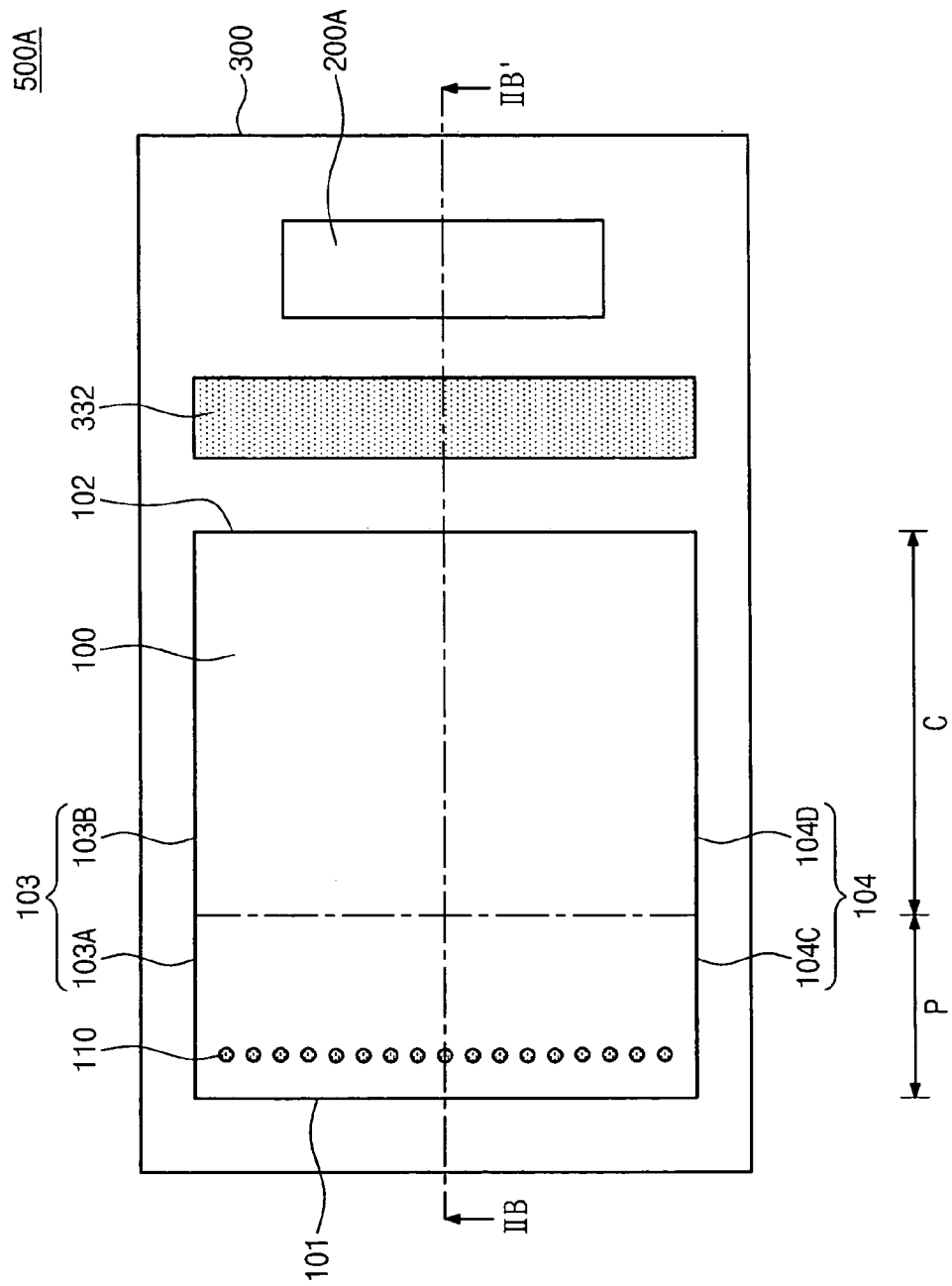

SEMICONDUCTOR PACKAGE

CROSS-REFERENCE TO RELATED APPLICATIONS

This application claims priority under 35 U.S.C. §119 to Korean Patent Application No. 10-2008-0085380, filed on Aug. 29, 2008, in the Korean Intellectual Property Office (KIPO), the entire contents of which are herein incorporated by reference.

BACKGROUND

1. Field

Example embodiments relate to a semiconductor package, and more particularly, to a multi-chip package.

2. Description of the Related Art

Improved packaging of high density electronic packages may allow for the fabrication of relatively compact, slim, and lightweight electronic devices. Improved packaging technology is important in at least the computer field because the size of various computer components, for example, semiconductor components including high capacity random access memories (RAMs), may be increased in order to accommodate a need for increased memory capacity.

Many devices for reducing the size of a package have been introduced. For example, a stack-type semiconductor package has been introduced, in which a plurality of semiconductor chips, or a semiconductor device package, is stacked. Also, a semiconductor module has been introduced, in which a plurality of semiconductor chips, a plurality of device packages, and/or a stack-type semiconductor package is stacked in a planar manner on at least one surface of a printed circuit board (PCB).

Such packages may be classified into a multi-chip package in which a plurality of semiconductor chips functioning differently from each other are mounted (or stacked), and a semiconductor-chip-stack-type package in which a plurality of same semiconductor chips are stacked to achieve a high capacity.

SUMMARY

Example embodiments may provide a semiconductor package having an improved thermal reliability.

In accordance with example embodiments, a first substrate including at least one first substrate pad and at least one second substrate pad spaced apart from each other, at least one first semiconductor chip stacked on the first substrate and having a first side surface and a second side surface and including a cell region and a peripheral circuit region., at least one first chip pad on the at least one first semiconductor chip, the at least one first chip pad being arranged adjacent to the first side surface, and on the at least one first substrate pad so as to be electrically connected to the at least one first substrate pad, a second semiconductor chip adjacent to the second side surface and including at least one second chip pad and electrically connected to the at least one second substrate pad; and a heat insulation member provided to the first substrate between the at least one first chip and the at least one second substrate pad.

In accordance with example embodiments, a semiconductor package may include a first substrate including a first substrate pad and a second substrate pad spaced apart from each other. The semiconductor package may further include first semiconductor chips stacked on the first substrate and having a first side surface and a second side surface and including a cell region and a peripheral circuit region, the first and second side surfaces facing each other. The semiconductor package may further include first chip pads disposed on the first substrate pad and adjacent to the first side surface and provided to the respective first semiconductor chips in the peripheral circuit region and electrically connected to the first substrate pad and a second semiconductor chip disposed toward the second side surface and including a second chip pad spaced apart from the first chip pad and electrically connected to the second substrate pad.

In accordance with example embodiments, the first side surface may include a surface in an edge of the first semiconductor chips in the peripheral circuit region, and the second side surface may include a surface in an edge of the first semiconductor chips in the cell region.

In accordance with example embodiments, the semiconductor packages may further include through-electrodes passing through the respective first semiconductor chips in the peripheral circuit region and contacting the first chip pads, wherein the second semiconductor chip may be spaced apart from the through-electrodes.

In accordance with example embodiments, the first semiconductor chips may include memory chips, and the second semiconductor chip may include a logic chip.

In accordance with example embodiments, the semiconductor packages may further include a heat insulation member provided to the first substrate between the first substrate pad and the second substrate pad. The heat insulation member may include a first heat conduction pattern, and the first heat conduction pattern may be provided to a top surface of the first substrate and spaced apart from both the second side surface and the second substrate pad.

In accordance with example embodiments, the heat insulation member may further include a second heat conduction pattern, and the second heat conduction pattern may be disposed in the first substrate and connected to the first heat conduction pattern.

In accordance with example embodiments, the semiconductor packages may further include a connection terminal disposed on a bottom surface of the first substrate, and electrically connected to the first and second substrate pads. The connection terminal may include a dummy connection terminal electrically insulated from the first and second substrate pads, and the dummy connection terminal may be connected to the second heat conduction pattern.

In accordance with example embodiments, the second semiconductor chip may be disposed on the cell region of the first semiconductor chips. The second semiconductor chip may be adjacent to the second side surface. The second chip pad may be adjacent to the second side surface and disposed on a top surface of the second semiconductor chip. The semiconductor packages may further include an interconnection electrically connecting the second chip pad to the second substrate pad.

In accordance with example embodiments, the second semiconductor chip may be disposed on the second substrate pad. The second chip pad may be disposed on a bottom surface of the second semiconductor chip. The semiconductor packages may further include a connection member disposed between the second chip pad and the second substrate pad.

In accordance with example embodiments, the first substrate may include a trench spaced apart laterally from the first substrate pad. The trench may be adjacent to the second side surface, and the second semiconductor chip may be inserted in the trench, and the first semiconductor chips may cover the trench.

In accordance with example embodiments, the semiconductor packages may further include a third semiconductor chip disposed on the first semiconductor chips and including a third chip pad electrically connected to the first substrate pad. The third semiconductor chip may include a central processing unit (CPU) chip.

In accordance with example embodiments, the semiconductor packages may further include a second substrate disposed under the first substrate and a fourth semiconductor chip disposed on the second substrate between the first substrate and the second substrate and electrically connected to the first semiconductor chips and the second semiconductor chip. The fourth semiconductor chip may include a memory chip or a logic chip.

BRIEF DESCRIPTION OF THE FIGURES

The accompanying figures are included to provide a further understanding of example embodiments, and are incorporated in and constitute a part of this specification. The drawings illustrate example embodiments and, together with the description, serve to explain principles of example embodiments. In the figures:

FIG. 1A is a plan view illustrating a semiconductor package according to example embodiments;

FIG. 2A is a plan view illustrating a semiconductor package according to example embodiments;

DETAILED DESCRIPTION OF EXAMPLE EMBODIMENTS

Figure 1B:
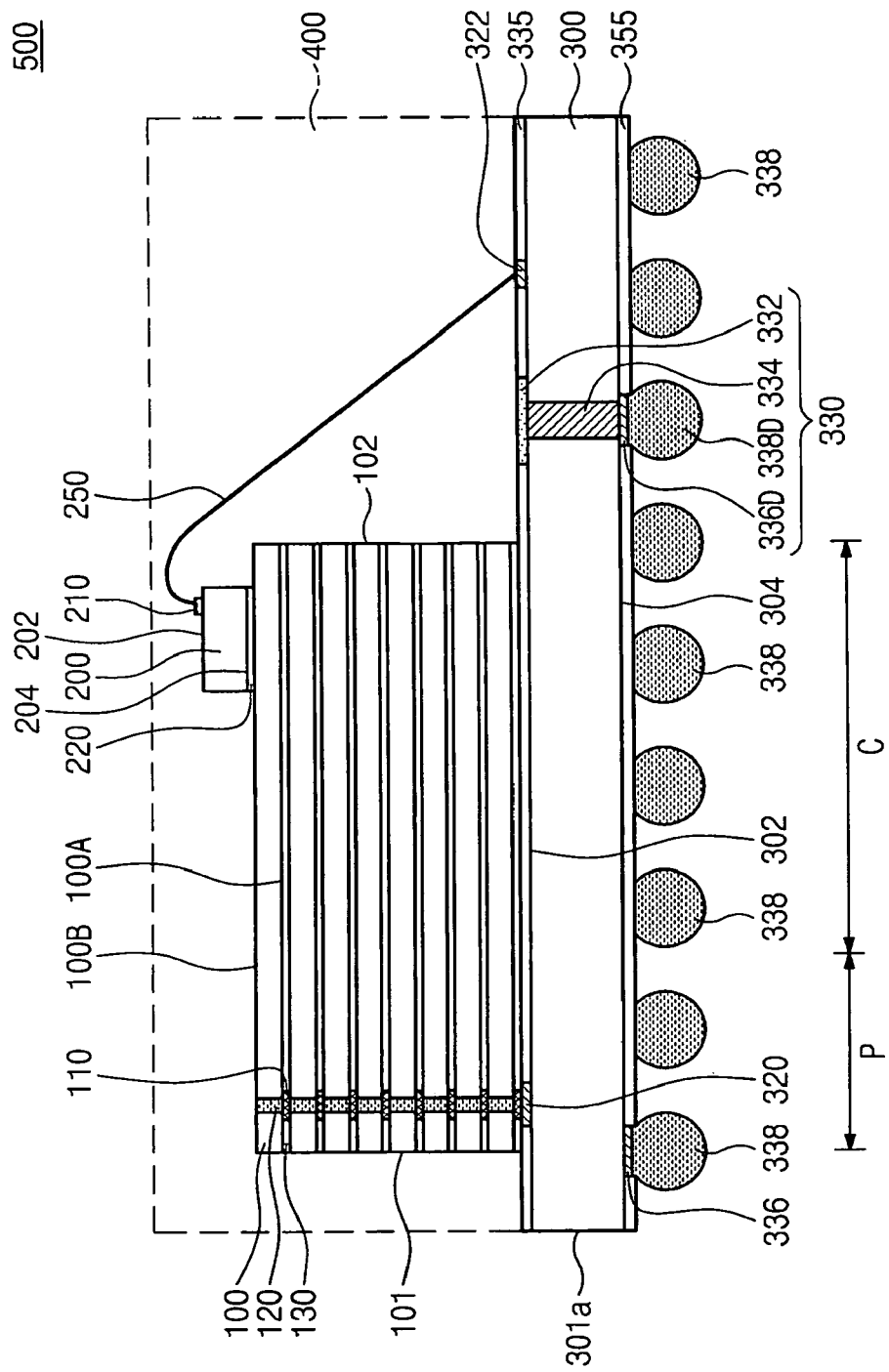
FIG. 1B is a cross-sectional view taken along line IB-IB' of FIG. 1A.

Example embodiments will now be described more fully with reference to the accompanying drawings, in which example embodiments are shown. The invention may, however, be embodied in different forms and should not be construed as limited to example embodiments set forth herein. Rather, example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

FIG. 1A is a plan view illustrating a semiconductor package 500 according to example embodiments. FIG. 1B is a cross-sectional view taken along line IB-IB' of FIG. 1A.

Referring to FIGS. 1A and 1B, the semiconductor package 500 may include a substrate 300, first semiconductor chips 100 stacked on the substrate 300, a second semiconductor chip 200, and a heat insulation member 330 (the heat insulation member 330 being an example of a heat transfer member, where the heat transfer member may be a thermally conductive member). The semiconductor package 500 may be a multi-chip package (MCP).

The substrate 300 may be an interconnection substrate, which may include a conductive interconnection (not shown) for transmitting electrical signals. The substrate 300 may have a top surface 302 and a bottom surface 304 facing the top surface 302. A first substrate pad 320 may be provided on the top surface 302 of the substrate 300. The substrate pad 320 may be electrically connected to the conductive interconnection of the substrate 300. The first substrate pad 320 may include copper (Cu), aluminum (Al), nickel (Ni), platinum (Pt), silver (Ag), gold (Au), or a combination thereof, having a relatively high electrical conductivity. The top surface 302 of the substrate 300 may be provided with an upper dielectric layer 335 exposing the first substrate pad 320. In accordance with example embodiments, the first substrate pad 320 may be provided as a plurality of first substrate pads 320. For example, the first substrate pads 320 may be provided as a plurality of first substrate pads 320 that are spaced apart from each other and are arranged in a line parallel with, and adjacent to, an edge 301a of the substrate 300. However, example embodiments are not limited thereto as the first substrate pads 320 may be arranged in a pattern other than a straight line.

Connection terminals 338 may be disposed on the bottom surface 304 of the substrate 300. The Connection terminals 338 may be electrically connected to the conductive interconnection. The connection terminals 338 may be adapted for connecting to an external device (not shown). The connection terminals 338 may be, for example, a solder ball or a solder bump. The connection terminals 338 may include one of gold, silver, nickel, copper and tin alloys. The connection terminals 338 may include a combination of two or more materials, which may be, for example, copper-nickel-lead (Cu—Ni—Pb), copper-nickel-gold (Cu—Ni—Au), copper-nickel (Cu—Ni), nickel-gold (Ni—Au), or nickel-silver (Ni—Ag). The connection terminals 338 may include a dummy connection terminal 338D. The dummy connection terminal 338D may be electrically insulated from a terminal for grounding or an interconnection circuit. The dummy connection terminal 338D may be electrically insulated from the first substrate pad 320 and a second substrate pad 322 that will be described later. In accordance with example embodiments, the dummy connection terminal 338D may be provided as a plurality of dummy connection terminals 338D that are electrically insulated from the terminal for grounding or the interconnection terminal and may be insulated from the first and second substrate pads 320 and 322.

A connection pad 336 may be disposed between a connection terminal 338 and the bottom surface 304 of the substrate 300. For example, the connection pad 336 may include copper (Cu), aluminum (Al), nickel (Ni), platinum (Pt), silver (Ag), gold (Au), or a combination thereof, having relatively high electrical conductivity. The bottom surface 304 of the substrate 300 may be provided with a lower dielectric layer 355 exposing the connection pad 336. A dummy connection pad 336D may be disposed between the dummy connection terminals 338D and the bottom surface 304 of the substrate 300. In accordance with example embodiments, the connection pad 336 may be provided as a plurality of connection pads 336 disposed between each of the connection terminals 338 and the bottom surface 304 of the substrate 300 and the dummy connection pad 336D may be provided as a plurality of connection pads 336D that may be disposed a plurality of dummy connection terminals 338D and the bottom surface 304 of the substrate 300.

Each of the first semiconductor chips 100 may include a first surface 100A and a second surface 100B facing the first surface 100A. Each of the first semiconductor chips 100 may be stacked on the substrate 300 and may be attached to each other via an adhesive layer 130. Each of the first semiconductor chips 100 may include a peripheral circuit region P and a cell region C.

A line 105 of FIG. 1A may be a boundary line between the peripheral circuit region P and the cell region C. The first semiconductor chips 100 may include a non-volatile memory, a random access volatile memory, and/or other memories. The first semiconductor chips 100 may also include a flash memory chip, a PRAM chip, an SRAM chip, an MRAM chip, a DRAM chip, or a combination thereof.

The stacked first semiconductor chips 100 may include a first side surface 101 and a second side surface 102 that may face each other, and a third side surface 103 and a fourth side surface 104 that connect to the first and second side surfaces 101 and 102 and face each other. The first side surface 101 may be a surface including the edge of the first semiconductor chips 100 in the peripheral circuit region P. The second side surface 102 may be a surface including the edge of the first semiconductor chips 100 in the cell region C. The third side surface 103 may include an A side surface 103A contacting the peripheral circuit region P, and a B side surface 103B contacting the cell region C. The fourth side surface 104 may include a C side surface 103C contacting the peripheral circuit region P, and a D side surface 104D contacting the cell region C.

Each of the first semiconductor chips 100 may be a silicon chip and may include an integrated circuit (not shown) therein. Each of the first semiconductor chips 100 may include a first chip pad 110 that may be disposed between the first and second surfaces 100A and 100B in the peripheral circuit region P of the first semiconductor chips 100. The first chip pad 110 may be electrically connected to the integrated circuit. The first chip pad 110 may be adjacent to the first side surface 101. In accordance with example embodiments, each of the first chip pads 110 on each of the first semiconductor chips 100 may be provided as a plurality of first chip pads 110 on each of the first semiconductor chips 100 such that the pluralities of first chip pads 110 correspond to a plurality of first substrate pads 320 on the substrate 300. Each of the first chip pads 110 of the plurality of first chip pads 110 on each of the first semiconductor chips 100 may be spaced from each other and arranged in a single line parallel with the first side surface 101. For example, FIG. 1A illustrates a plurality of first chip pads 110 arranged on a first semiconductor chip 100 such that each of the first chip pads 110 are arranged in a single line parallel with the first side surface 101. The lowest first chip pad 110 of the first semiconductor chips 100 may electrically contact the first substrate pad 320.

Through-electrodes 120 may pass through each of the first semiconductor chips 100 in the peripheral circuit region P and may contact the first chip pads 110. The through-electrodes 120 may be through silicon vias (TSV). For example, the through-electrodes 120 may have a cylindrical shape. The through-electrodes 120 may be provided in plurality and may be spaced apart from each other. The through-electrodes 120 may be formed to correspond to the first chip pads 110. The respective first semiconductor chips 100 may be electrically connected through the through-electrodes 120 and the first chip pads 110. The through-electrodes 120 may be coupled to the first chip pads 110 to physically fix the stacked first semiconductor chips 100.

According to example embodiments, a semiconductor package may use the through-electrodes 120 rather than circular solder balls between the stacked first semiconductor chips 100. Thus, the number of the stacked first semiconductor chips 100 may be increased by the size of the circular solder balls. Accordingly, memory capacity of the semiconductor package 500 may be increased.

In example embodiments, most of the electrical power may be consumed in the peripheral circuit region P of the first semiconductor chips 100. The first chip pads 110 and the through-electrodes 120 which may become paths adapted to electrically connect integrated circuits of the first semiconductor chips 100 to the interconnection circuit of the substrate 300. As a result, the first chip pads 110 and the through-electrodes 120 may emit a great amount of heat. In example embodiments, the first chip pads 110 and the through-electrodes 120 may be disposed near the first side surface 101, so that heat of the first chip pads 110 and the through-electrodes 120 may be efficiently released from the stacked first semiconductor chips 100.

The second semiconductor chip 200 may be on the substrate 300. The second semiconductor chip 200 may be spaced apart from the first chip pads 110 and the through-electrodes 120. The second semiconductor chip 200 may have a top surface 202 and a bottom surface 204 that face each other. The second semiconductor chip 200 may have a smaller area than the first semiconductor chips 100. The second semiconductor chip 200 may be adhered, via an adhesive layer 220, to the second surface 100B in the cell region C of the first semiconductor chips 100. In example embodiments, the second semiconductor chip 200 may be adjacent to the second side surface 102. For example, the second semiconductor chip 200 may be adjacent to the second side surface 102 and the B side surface 103B. As other examples, the second semiconductor chip 200 may be adjacent to the second side surface 102 and the D side surface 104D. As still other examples, the second semiconductor chip 200 may be adjacent to the third side surface 103 or the forth side surface 104. In example embodiments, the second semiconductor chip 200 may be a logic chip functioning differently from the first semiconductor chips 100. For example, the second semiconductor chip 200 may be a controller chip. The second semiconductor chip 200 may include one or more microprocessors, digital signal processors, micro controllers, or similarities.

A second substrate pad 322 may be provided on the top surface 302 of the substrate 300 and may have the same thickness and the same level as that of the first substrate pad 320. The second substrate pad 322 may include the same material as that of the first substrate pads 320. The second substrate pad 322 may be exposed through the upper dielectric layer 335. As shown in FIG. 1B, the second substrate pad 322 may be spaced apart from the first substrate pad 320 and may be spaced apart from the second side surface 102. As shown in FIG. 1A, the second substrate pad 322 may be provided as a plurality of second substrate pads 322 arranged in a line that may be parallel with the second side surface 102. In accordance with example embodiments, each of the second substrate pads 322 of the plurality of substrate pads 322 may be spaced apart from each other. The second substrate pads 322 may be electrically connected to the conductive interconnection.

A second chip pad 210 may be provided on the top surface 202 of the second semiconductor chip 200. The second chip pad 210 may be electrically connected to a circuit pattern (not shown) disposed in the second semiconductor chip 200. The second chip pad 210 may be adjacent to the second side surface 102. The second chip pad 210 may be provided as a plurality of second chip pads 210 that may be spaced apart from each other. Each of the second chip pads 210 of the plurality of second chip pads 210 may be arranged in a line that is parallel with the second side surface 102. For example, FIG. 1A illustrates a second semiconductor chip having a plurality of second chip pads 210 that may be arranged to be parallel with the second side surface 102. As shown in FIG. 1A, each of the second chip pads 210 may correspond to each of the second substrate pads 322. The second substrate pads 322 may be electrically connected to the second chip pads 210 through interconnections 250 provided through wire bonding, e.g., a gold wire. The first semiconductor chip 100 may be connected to the second semiconductor chip 200 through the interconnection circuit.

The second chip pads 210 may be electrically connected to the circuit pattern in the second semiconductor chip 200 and may be electrically connected to the interconnection circuit of the substrate 300. The second chip may emit a great amount of heat. According to example embodiments, the second semiconductor chip 200 may be adjacent to the second side surface 102, so that the second semiconductor chip 200 may be spaced apart from the peripheral circuit region P. In addition, the second chip pads 210 may be adjacent to the second side surface 102. For example, the second chip pads 210 may be spaced far from the through-electrodes 120 and the first chip pads 110. Accordingly, heat generated from the first semiconductor chips 100 may be separated from heat generated from the second semiconductor chip 200 disposed on the first semiconductor chips 100, so as to prevent or reduce a heat concentration in the semiconductor package 500.

In addition, the second substrate pads 322, electrically connected to the second chip pads 210 and electrically connected to the interconnection circuit of the substrate 300, may emit a great amount of heat. According to example embodiments, the second substrate pads 322 may be spaced apart from the first chip pads 110, the through-electrodes 120, and the second chip pads 210, so that heat generated from the first chip pads 110, the through-electrodes 120, and the second chip pads 210 may be separated from heat generated from the second substrate pads 322 and the heat concentration may be prevented or reduced.

The heat insulation member 330 may be provided to the substrate 300 between the second side surface 102 and the second substrate pads 322. The heat insulation member 330 may include a first heat conduction pattern 332, a second heat conduction pattern 334, the dummy connection terminal 338D, and the dummy connection pad 336D.

The first heat conduction pattern 332 may be provided on the top surface 302 of the substrate 300 between the second side surface 102 and the second substrate pads 322. The first heat conduction pattern 332 may be spaced apart from the second side surface 102 and the second substrate pads 322. For example, the first heat conduction pattern 332 may have a line shape parallel with the second side surface 102. The line shape may include a lattice pattern to increase the area for heat emission. The first heat conduction pattern 332 may include a plurality of conduction patterns, portions of which are connected to each other. The first heat conduction pattern 332 may have the same thickness and the same level as those of the first and second substrate pads 320 and 322. The first heat conduction pattern 332 may include the same material as those of the first and second substrate pads 320 and 322. For example, the first heat conduction pattern 332 may include copper (Cu), aluminum (Al), nickel (Ni), platinum (Pt), silver (Ag), gold (Au), or a combination thereof, having a relatively high heat conductivity.

The second heat conduction pattern 334 may be disposed in the substrate 300. For example, the second heat conduction pattern 334 may be connected to the first heat conduction pattern 332, passing through the substrate 300. The second heat conduction pattern 334 may have the same material as that of the first heat conduction pattern 332.

The dummy connection terminal 338D may have the same thickness and the same level as those of the connection terminal 338, and may be connected to the second heat conduction pattern 334. The dummy connection terminal 338D may have the same material as that of the connection terminal 338.

The dummy connection pad 336D may be disposed between the second heat conduction pattern 334 and the dummy connection terminal 338D. The dummy connection pad 336D may have the same thickness and the same level as the connection pad 336. The dummy connection pad 336D may have the same material as that of the connection pad 336.

According to example embodiments, the heat insulation member 330 may prevent or reduce the heat concentration due to the heat generated from the peripheral circuit region P including the through-electrodes 120 and moving along the first semiconductor chips 100 and the substrate 300, heat generated from the second semiconductor chip 200 including the second chip pads 210 and moving along the substrate 300, and heat generated from the second substrate pads 322 and moving along the substrate 300.

A molding part 400 may seal the first semiconductor chips 100, the second semiconductor chip 200, the interconnections 250, and the first heat conduction pattern 332.

Figure 2B:
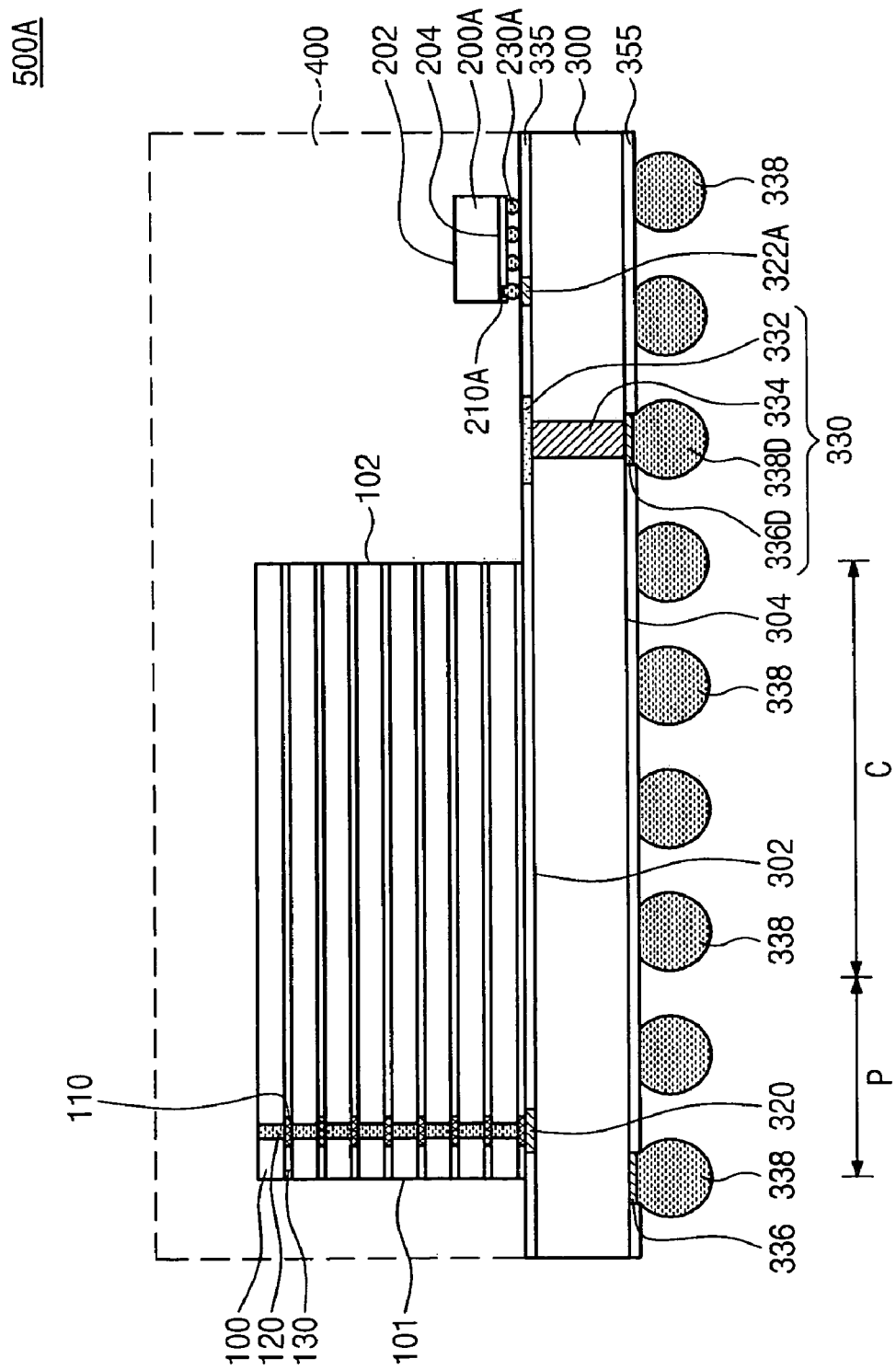
FIG. 2B is a cross-sectional view taken along line IIB-IIB' of FIG. 2A.

FIG. 2A is a plan view illustrating a semiconductor package 500A according to example embodiments. FIG. 2B is a cross-sectional view taken along line IIB-IIB' of FIG. 2A. The semiconductor package 500A may be similar to the previous semiconductor package 500. Thus, the same part as that of the previous embodiment will be schematically described or omitted for convenience. Arrangement of a second semiconductor chip 200A in the semiconductor package 500A will be mainly described, because the second semiconductor chip 200A may be different from that of the semiconductor package 500.

Referring to FIGS. 2A and 2B, the stacked first semiconductor chips 100 may include the first side surface 101 and the second side surface 102 that face each other, and the third side surface 103 and the fourth side surface 104 that connect to the first and second side surfaces 101 and 102 and face each other. The first side surface 101 may be a surface passing through the edge of the first semiconductor chips 100 of the peripheral circuit region P. The second side surface 102 may be a surface passing through the edge of the first semiconductor chips 100 of the cell region C.

Second substrate pads 322A may be provided on the top surface 302 of the substrate 300 and may be spaced apart from the second side surface 102. The second semiconductor chip 200A may be disposed on the second substrate pads 322A. Different from the arrangement of FIGS. 1A and 1B, a second chip pad 210A may be provided on a bottom surface 204 of the second semiconductor chip 200A. For example, the second chip pad 210A may be provided in plurality and spaced apart from each other, corresponding to the second substrate pads 322A. A connection member 230A, for example, a solder bump or a solder ball, may be disposed between the second chip pads 210A and the second substrate pads 322A.

According to example embodiments, the second semiconductor chip 200A is spaced apart from the first semiconductor chips 100, so that heat generated from the first semiconductor chips 100 may be separated from heat generated from the second semiconductor chip 200A. The heat insulation member 330 may effectively reduce or prevent movement of the heat generated from the second semiconductor chip 200A, so that the heat concentration on the first semiconductor chips 100 may be reduced. Accordingly, the semiconductor package 500A may have improved thermal reliability compared to the semiconductor package 500 illustrated in FIGS. 1A and 1B.

In addition, because the second chip pads 210A may be connected to the second substrate pads 322A through the connection member 230A, e.g., a solder bump or a solder ball, as opposed to a bonding wire, the number of the stacked first semiconductor chips 100 may be increased or the thickness of the semiconductor package 500A may be decreased, corresponding to the thickness of the second semiconductor chip 200A and the track of the bonding wire.

Figure 3A:
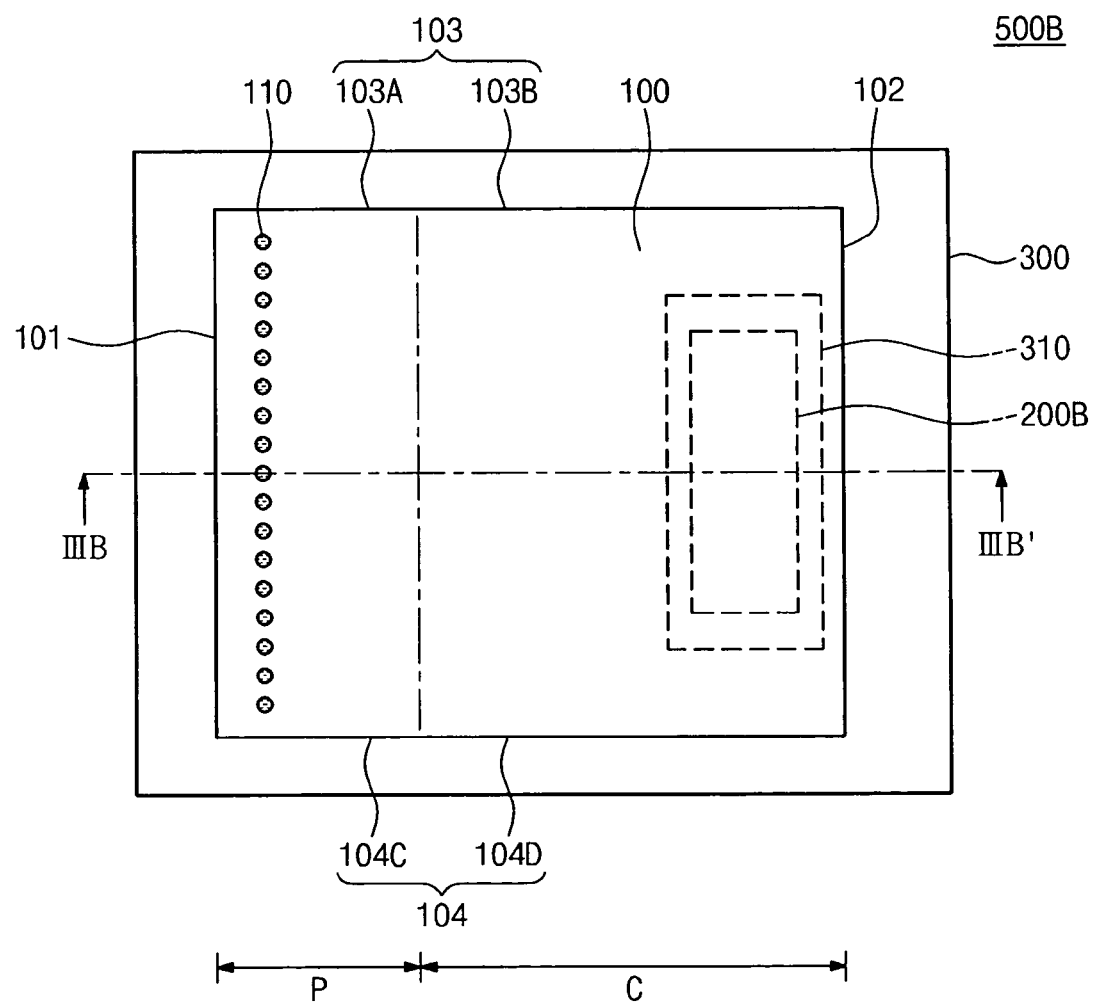
FIG. 3A is a plan view illustrating a semiconductor package according to example embodiments.
Figure 3B:
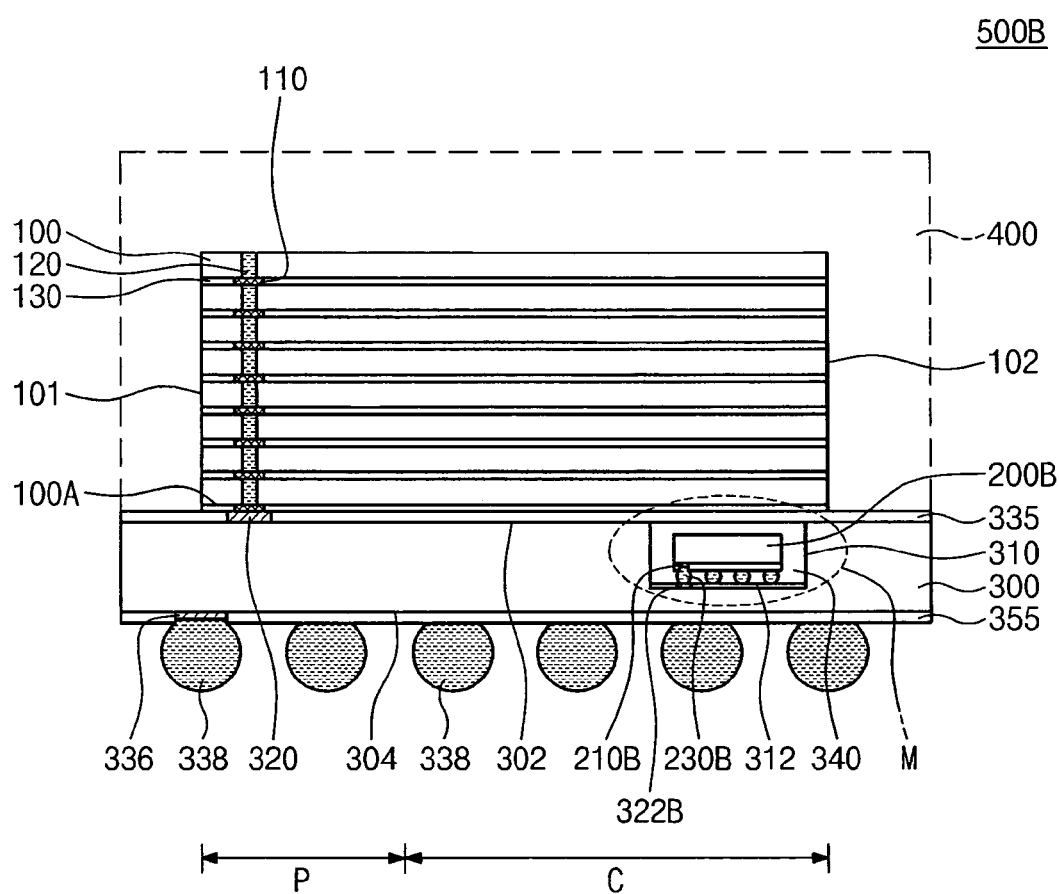
FIG. 3B is a cross-sectional view taken along line IIIB-IIIB' of FIG. 3A.
Figure 3C:
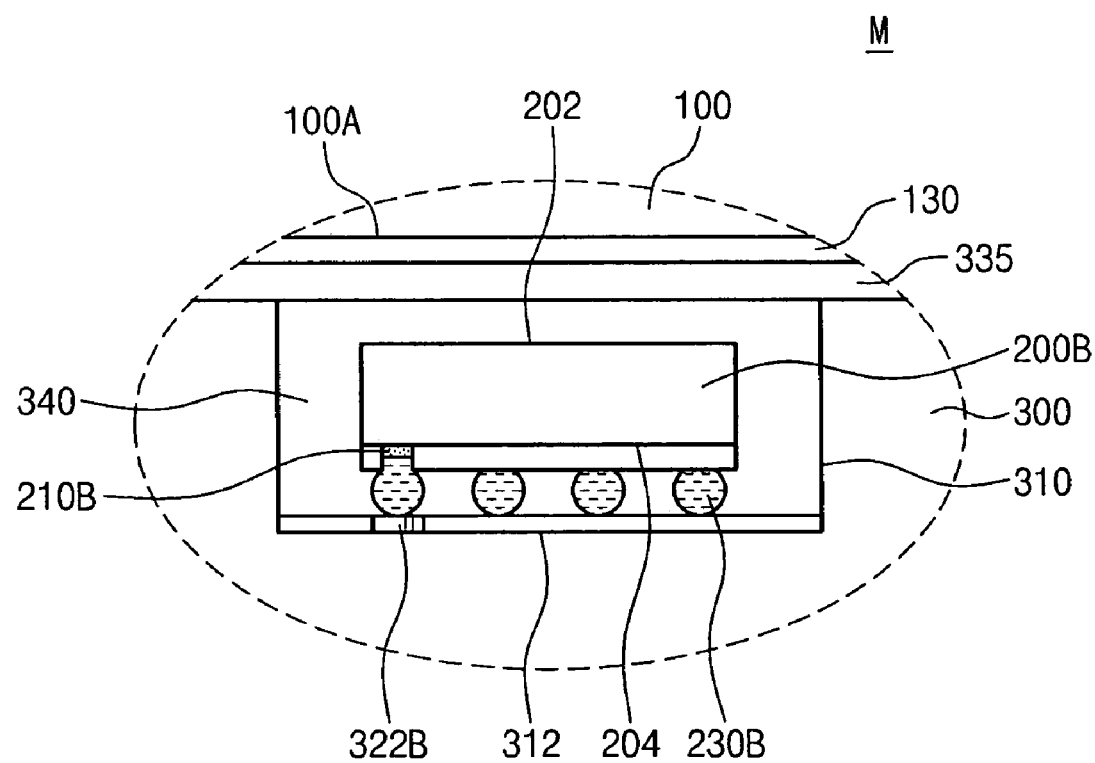
FIG. 3C is an enlarged view illustrating a portion M of FIG. 3B.

FIG. 3A is a plan view illustrating a semiconductor package 500B according to example embodiments. FIG. 3B is a cross-sectional view taken along line IIIB-IIIB' of FIG. 3A. FIG. 3C is an enlarged view illustrating a portion M of FIG. 3B. The semiconductor package 500B may be similar to the previous semiconductor packages 500 and 500A. Thus, the same part as those of the previous embodiments will be schematically described or omitted for convenience.

Referring to FIGS. 3A, 3B and 3C, the stacked first semiconductor chips 100 may include the first side surface 101 and the second side surface 102 that face each other, and the third side surface 103 and the fourth side surface 104 that connect to the first and second side surfaces 101 and 102 and face each other. The first side surface 101 may be a surface in the edge of the first semiconductor chips 100 of the peripheral circuit region P. The second side surface 102 may be a surface in the edge of the first semiconductor chips 100 of the cell region C. The third side surface 103 may include the side surface 103A contacting the peripheral circuit region P, and the B side surface 103B contacting the cell region C. The fourth side surface 104 may include the C side surface 103C contacting the peripheral circuit region P, and the D side surface 104D contacting the cell region C.

The substrate 300 may include a trench 310 spaced apart laterally from the first chip pads 110 and the through-electrodes 120. The trench 310 may be disposed under the first surface 100A of the lowest first semiconductor chip 100, in the cell region C. The trench 310 may be adjacent to the second side surface 102, and covered by the first semiconductor chips 100. The trench 310 may be adjacent to the second side surface 102 and the B side surface 103B. The trench 310 may be adjacent to the second side surface 102 and the D side surface 104D.

A second semiconductor chip 200B may be inserted in the trench 310. A bottom surface 312 of the trench 310 may be provided with a second substrate pad 322B that may be electrically connected to a conductive interconnection (not shown) disposed in the substrate 300. The bottom surface 204 of the second semiconductor chip 200B may be provided with a second chip pad 210B corresponding to the second substrate pad 322B. Connection terminals 230B may be disposed between the second substrate pad 322B and the second chip pad 210B, so that the second substrate pad 322B may be electrically connected to the second chip pad 210B. For example, the connection terminal 230B may be a solder bump or a solder ball.

Unlike the semiconductor packages 500 and 500A illustrated in FIGS. 1A-2B, the substrate 300 illustrated in FIGS. 3A-3C may include the trench 310 spaced apart from the first substrate pads 320 and the through-electrodes 120. The second semiconductor chip 200B may be disposed in the trench 310, so as to prevent or reduce the heat concentration from the heat generated from the first semiconductor chips 100 and the second semiconductor chip 200B.

According to example embodiments, the bottom surface 312 of the trench 310 may be adjacent to the bottom surface 304 of the substrate 300, so that heat generated from the second semiconductor chip 200B may be efficiently released. The heat insulation member 330 (refer to FIGS. 1B and 2B) associated with the example semiconductor packages 500 and 500A may be omitted. In addition, because the trench 310 may be disposed under the first surfaces 100A of the cell region C, the semiconductor package 500B according to example embodiments may have a smaller area than the semiconductor packages 500 and 500A (refer to FIGS. 1B and 2B).

Figure 4A:
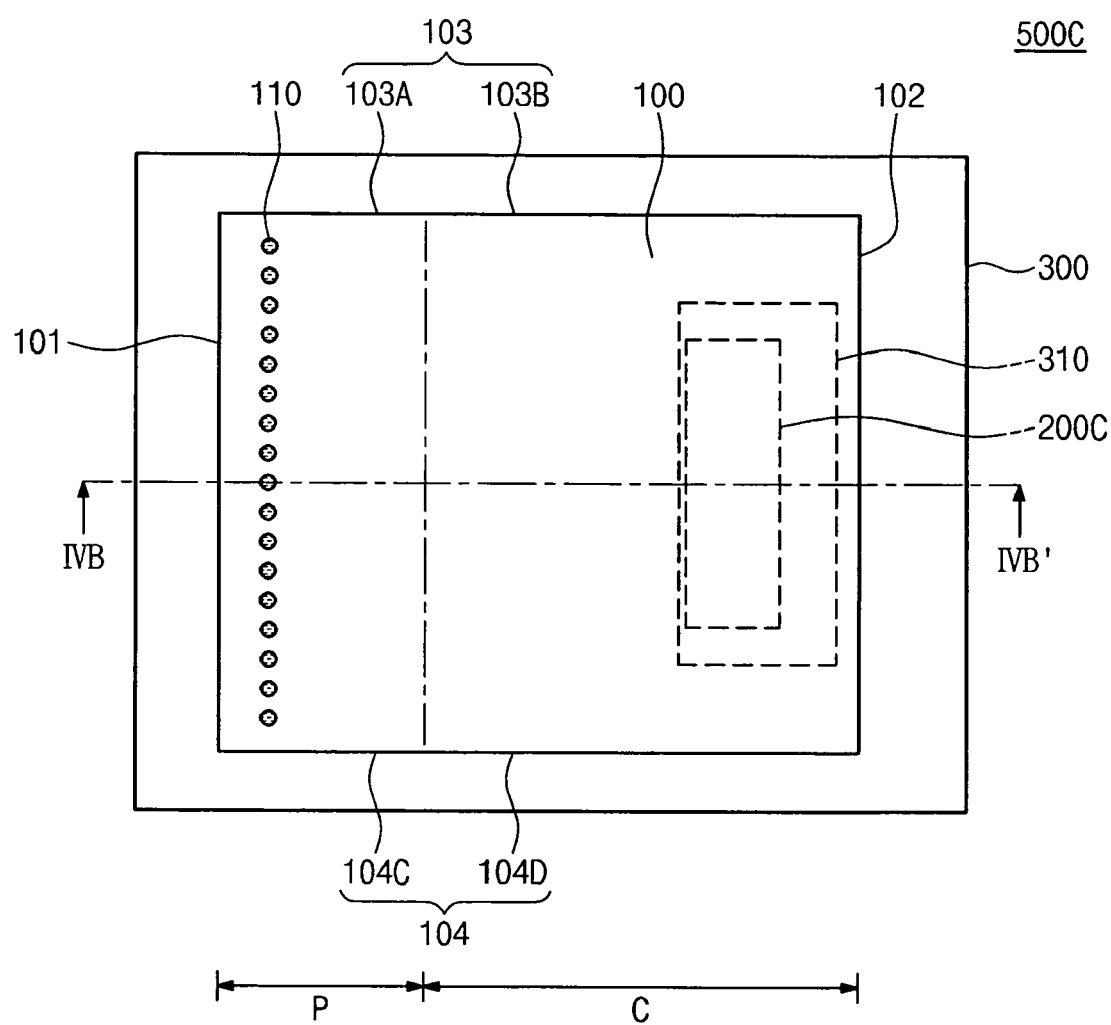
FIG. 4A is a plan view illustrating a semiconductor package according to example embodiments.
Figure 4B:
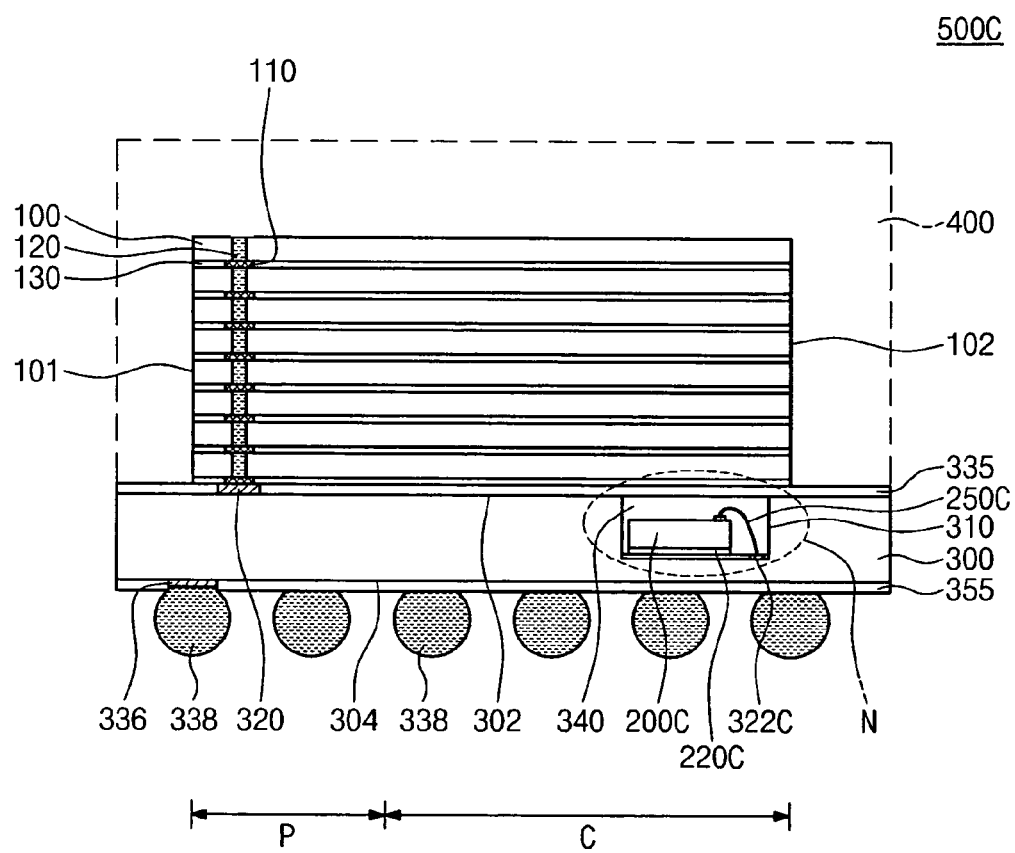
FIG. 4B is a cross-sectional view taken along line IVB-IVB' of FIG. 4A.

FIG. 4A is a plan view illustrating a semiconductor package 500C according to example embodiments. FIG. 4B is a cross-sectional view taken along line IVB-IVB' of FIG. 4A.

Figure 4C:
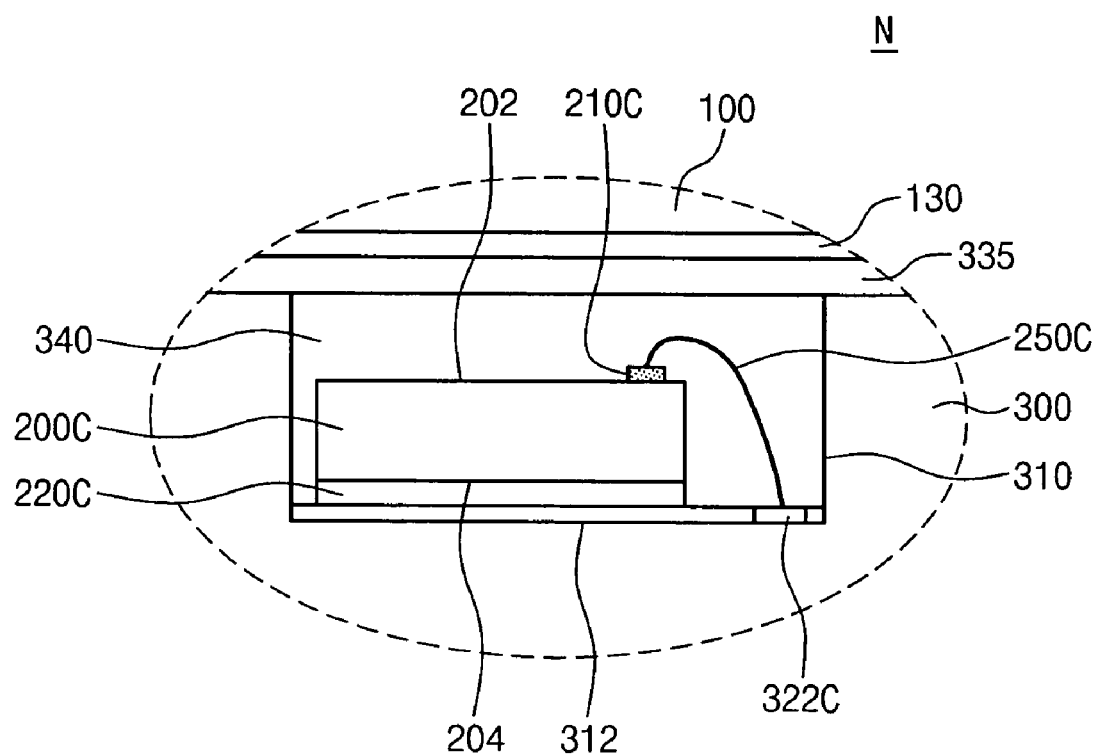
FIG. 4C is an enlarged view illustrating a portion N of FIG. 4B.

FIG. 4C is an enlarged view illustrating a portion N of FIG. 4B. The semiconductor package 500C may be similar to the previous semiconductor package 500B. Thus, the same part as that of the previous embodiment will be schematically described or omitted for convenience.

Referring to FIGS. 4A, 4B and 4C, a second semiconductor chip 200C may be adhered to a bottom surface 312 of the trench 310 via an adhesive layer 220C. As shown in FIGS. 4B and 4C, the second semiconductor chip 200C may be arranged to a side of the bottom surface 312 rather than in the middle of the bottom surface 312. A second substrate pad 322C may be provided to an opposite side of the bottom surface 312 and may be adhered to the bottom surface 312. The second substrate pad 322C may be adjacent to the second side surface 102. A second chip pad 210C may be provided on the top surface 202 of the second semiconductor chip 200C. The second chip pad 210C may be adjacent to the second side surface 102. The second chip pad 210C may be electrically connected to the second substrate pad 322C through a bonding wire 250C. A lower molding part 340 may fill the trench 310 provided with the second semiconductor chip 200C.

According to example embodiments, the second substrate pad 322C and the second chip pad 210C may be adjacent to the second side surface 102, so that a heat source generated from the second semiconductor chip 200C, e.g., the second substrate pad 322C and the second chip pad 210C, may be spaced far from the through-electrodes 120 and the first chip pads 110. Accordingly, the heat concentration in the semiconductor package 500C may be reduced relative to the arrangement of the second substrate pad 322B, the second chip pad 210B, and the connection terminal 230B, according to the semiconductor package 500B of FIG. 3C.

Figure 5:
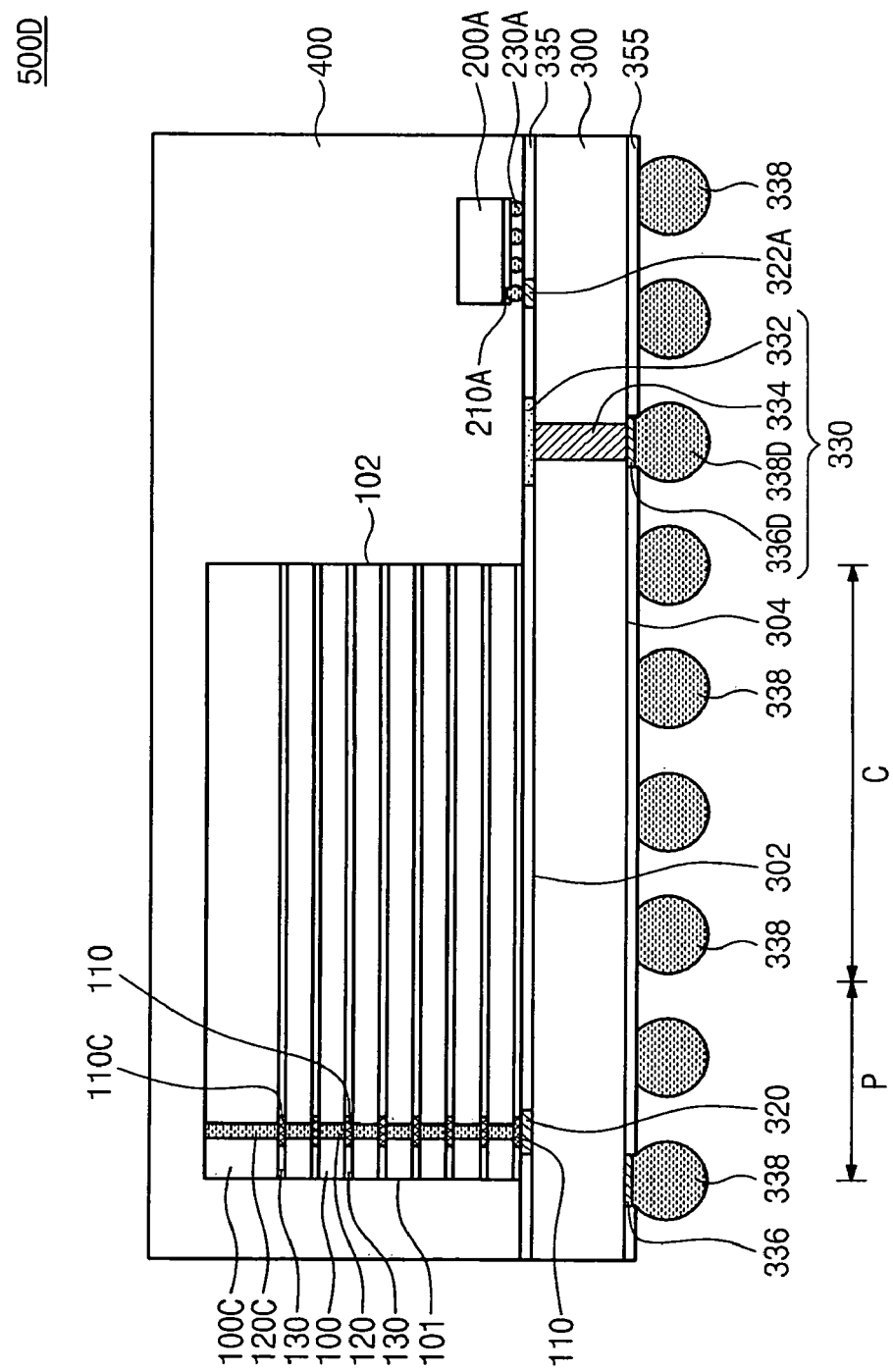
FIGS. 5 and 6 are cross-sectional views respectively illustrating a semiconductor package and a multi-layered multi chip package according to example embodiments.
Figure 6:
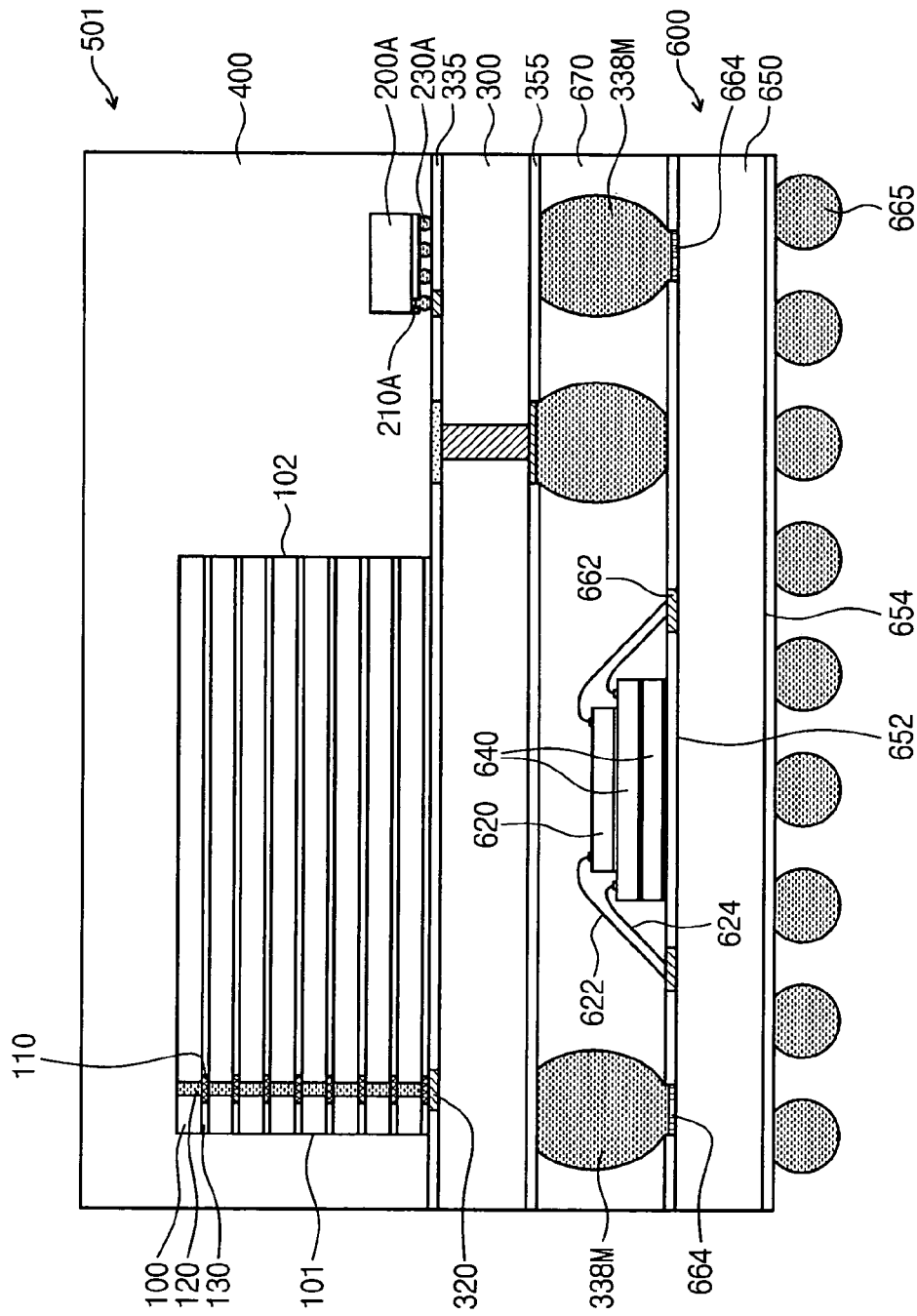

FIGS. 5 and 6 are cross-sectional views respectively illustrating a semiconductor package 500D and a multi-layered multi chip package according to example embodiments. The semiconductor package 500D may be similar to the previous semiconductor packages. Thus, the same part as those of the previous embodiments will be schematically described or omitted for convenience.

Referring to FIG. 5, stacked first semiconductor chips 100 and a central processing unit (CPU) chip 100C may be provided on the first semiconductor chips 100. The CPU chip 100C may include a central chip pad 110C and a central through-electrode 120C. The central chip pad 110C may be electrically connected to a circuit pattern (not shown) disposed in the CPU chip 100C. The central through-electrode 120C may pass through the CPU chip 100C on the peripheral circuit region P and connect electrically to the central chip pad 110C. The central through-electrode 120C may be omitted. The central chip pad 110C may contact the through-electrode 120 passing through the most upper first semiconductor chip 100, so that the first semiconductor chips 100 are electrically connected to the CPU chip 100C.

Unlike the semiconductor packages 500 of FIG. 1B, 500A of FIG. 2B, 500B of FIG. 3B, and 500C of FIG. 4B, the semiconductor package 500D may include the CPU chip 100C disposed on the first semiconductor chips 100. Thus, the semiconductor package 500D may be a system-in-package (SIP).

Referring to FIG. 6, an upper multi-chip package 501 and a lower multi-chip package 600 different from the upper multi-chip package 501 may be stacked vertically. For example, the upper multi-chip package 501 may be one of the semiconductor packages 500 of FIG. 1B, 500A of FIG. 2B, 500B of FIG. 3B, and 500C of FIG. 4B. Because the upper multi-chip package 501 is similar to those of the previous embodiments, detailed description thereof will be omitted. To provide a vertical space, connection terminals 338M may be provided on the bottom surface of the upper substrate 300 in the upper multi-chip package 501. The connection terminals 338M may be greater than the connection terminals 338 illustrated in FIGS. 1B, 2B, 3B, 4B, and 5.

The lower multi-chip package 600 may include a lower substrate 650, lower memory chips 640 stacked on the lower substrate 650, and a lower memory chip 640 on the lower memory chips 640. A conductive interconnection (not shown) may be disposed in the lower substrate 650. A first conductive pad 662 and a second conductive pad 664 may be provided on a top surface 652 of the lower substrate 650 and may be electrically connected to the conductive interconnection. External connection terminals 665 may be provided to a bottom surface 654 of the lower substrate 650 to electrically connect the upper multichip package 501 to an external device (not shown). As shown in FIG. 6, the top surface 652 of the lower substrate 650 may face the bottom surface 654 of the lower substrate 650.

The lower memory chips 640 may include a flash memory chip, a PRAM chip, an SRAM chip, an MRAM chip, a DRAM chip, or a combination thereof. A lower logic chip 620 may be a controller chip. Instead of the lower memory chips 640 and the lower logic chip 620, a lower CPU chip may be disposed on the lower substrate 650.

The lower memory chips 640 and the lower logic chip 620 may be electrically connected to the first conductive pad 662 through bonding wires 622 and 624. The upper multi-chip package 501 may be electrically connected to the lower multi-chip package 600 through the connection terminals 338M and the second conductive pad 664. A lower molding part 670 may seal the lower memory chips 640, the lower logic chip 620, the bonding wires 622 and 624, and the connection terminals 338M.

Figure 7:
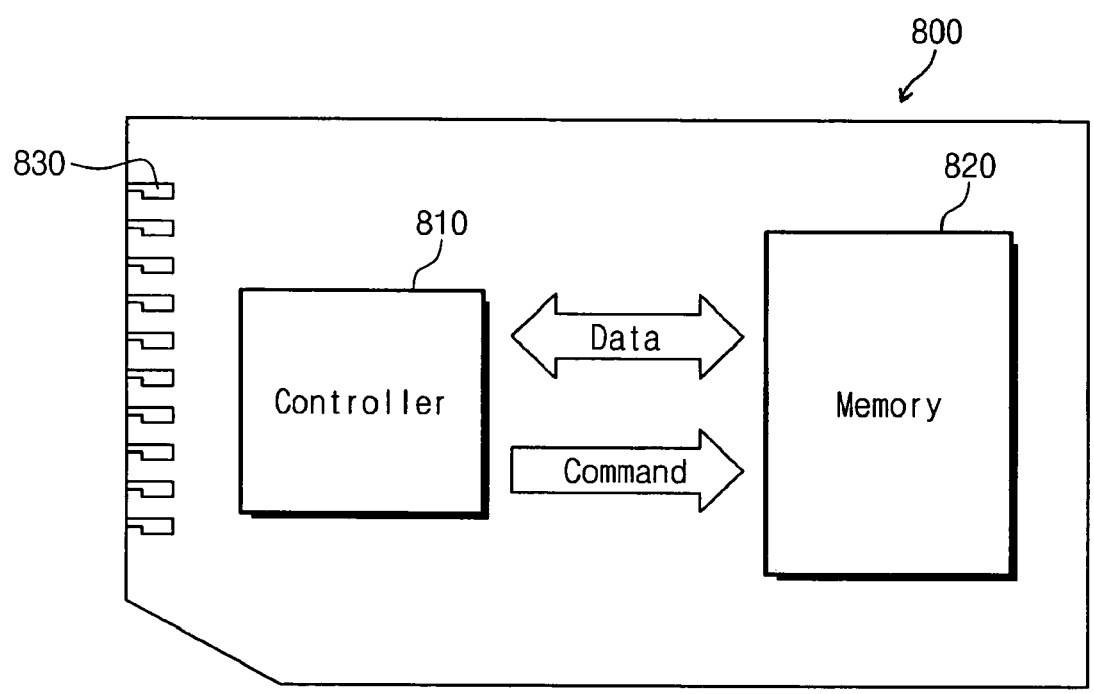
FIG. 7 is a view illustrating a memory card system including a semiconductor package according to example embodiments.

FIG. 7 is a view illustrating a memory card system 800 including a semiconductor package according to example embodiments. Referring to FIG. 7, the memory card system 800 may include a controller 810, a memory 820, and an interface 830. For example, the memory 820 may be used to store a command issued by the controller 810, and/or data of a user. The controller 810 and the memory 820 may be configured to receive and send a command and/or data. The interface 830 may be adapted to connect to the outside. The interface may, for example, be adapted for data input and output. The semiconductor package according to example embodiments may be a multi chip package (MCP) having an improved thermal reliability, which may function as the controller 810 and the memory 820.

Figure 8:
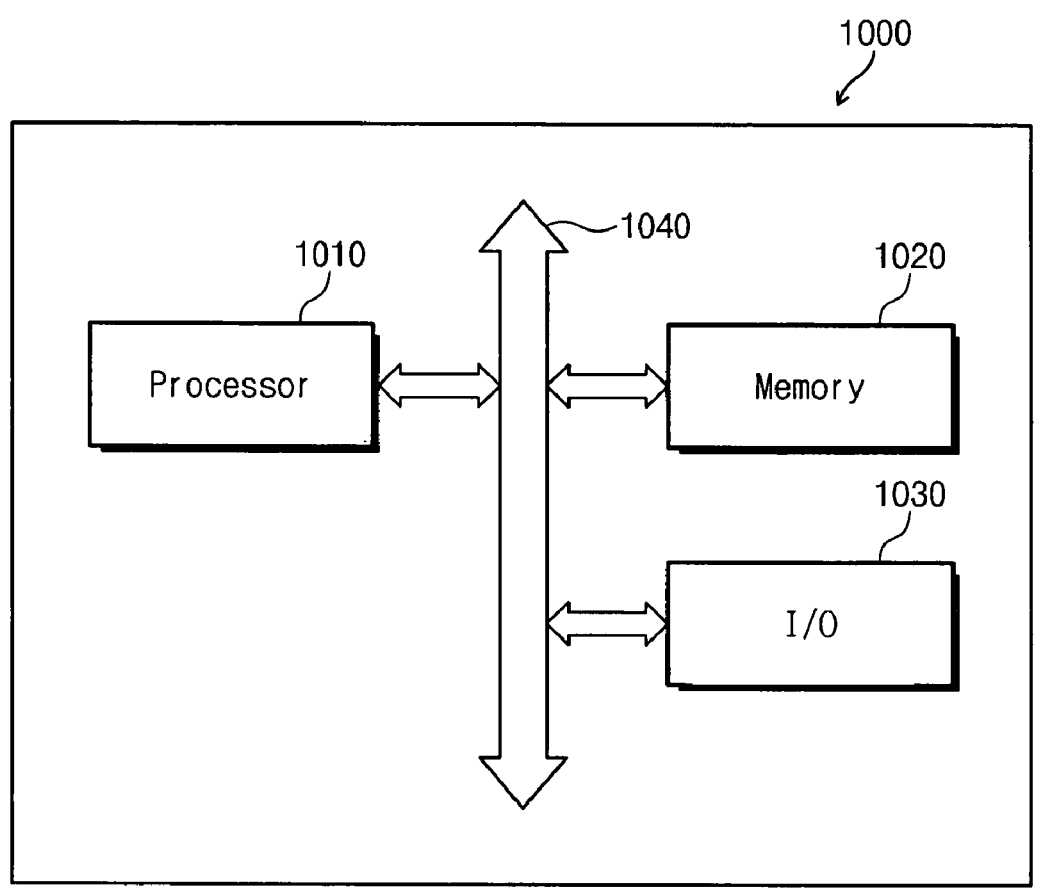
FIG. 8 is a block diagram illustrating an electronic device including a semiconductor package according to example embodiments.

The memory card system 800 may be a multimedia card (MMC), a secure digital card (SD), or a portable data storage device. FIG. 8 is a block diagram illustrating an electronic device 1000 including a semiconductor package according to example embodiments. Referring to FIG. 8, the electronic device 1000 may include a processor 1010, a memory 1020, and an input/output device (I/O) 1030. The processor 1010, the memory 1020, and the input/output device 1030 may be connected to each other through a bus 1040. The memory 1020 may receive control signals including RAS*, WE* and CAS* from the processor 1010. The memory 1020 may be used to store data that may be accessed through the bus 1040. It will be apparent to those skilled in the art that realizations and variations may be made by providing an additional circuit and an additional control signal.

The electronic device 1000 may be adapted to be applied to computer systems, wireless communication devices including PDAs, laptop computers, portable computers, web tablets, wireless telephones, mobile phones, digital music players, MP3 players, navigation systems, solid state disks (SSDs), household appliances, and any devices used for data transmission in a wireless environment.

According to example embodiments, the semiconductor packages have improved thermal reliability.

The above-disclosed subject matter is to be considered illustrative, and not restrictive, and the appended claims are intended to cover all such modifications, enhancements, and other embodiments, which fall within the true spirit and scope of example embodiments. Thus, to the maximum extent allowed by law, the scope of example embodiments is to be determined by the broadest permissible interpretation of the following claims and their equivalents, and shall not be restricted or limited by the foregoing detailed description.

What is claimed is:

1. A semiconductor package comprising:
a first substrate including at least one first substrate pad and at least one second substrate pad spaced apart from each other;
at least one first semiconductor chip stacked on the first substrate and having a first side surface and a second side surface and including a cell region and a peripheral circuit region;
at least one first chip pad on the at least one first semiconductor chip, the at least one first chip pad being arranged adjacent to the first side surface, and on the at least one first substrate pad so as to be electrically connected to the at least one first substrate pad;
a second semiconductor chip adjacent to the second side surface and including at least one second chip pad and electrically connected to the at least one second substrate pad;
a heat transfer member provided to the first substrate between the at least one first chip and the at least one second substrate pad; and
at least one connection terminal on a bottom surface of the first substrate, and electrically connected to the at least one first substrate pad or the at least one second substrate pad, wherein
the heat transfer member includes a first heat conduction pattern on a top surface of the first substrate between the second side surface and the at least one second substrate pad, and a second heat conduction pattern in the first substrate and connected to the first heat conduction pattern, and
the at least one connection terminal includes a dummy connection terminal electrically insulated from the at least one first substrate pad and the at least one second substrate pad, and the dummy connection terminal is connected to the second heat conduction pattern.

2. The semiconductor package of claim 1, further comprising:
at least one through-electrode passing through the at least one first semiconductor chip in the peripheral circuit region and contacting the at least one first chip pad, wherein the second semiconductor chip is spaced apart from the at least one through-electrode.

3. The semiconductor package of claim 1, wherein the at least one first semiconductor chip includes at least one memory chip, and the second semiconductor chip includes a logic chip.

4. A semiconductor package comprising:
a first substrate including at least one first substrate pad and at least one second substrate pad spaced apart from each other;
at least one first semiconductor chip stacked on the first substrate and having a first side surface and a second side surface and including a cell region and a peripheral circuit region;
at least one first chip pad on the at least one first semiconductor chip, the at least one first chip pad being arranged adjacent to the first side surface, and on the at least one first substrate pad so as to be electrically connected to the at least one first substrate pad;
a second semiconductor chip adjacent to the second side surface and including at least one second chip pad and electrically connected to the at least one second substrate pad;
a heat transfer member provided to the first substrate between the at least one first chip and the at least one second substrate pad, wherein the second semiconductor chip is on the cell region of the at least one first semiconductor chip.

5. The semiconductor package of claim 1, wherein the second semiconductor chip is between the at least one second substrate pad and the at least one first semiconductor pad.

6. The semiconductor package of claim 1, wherein the second semiconductor chip is on the at least one second substrate pad.

7. The semiconductor package of claim 6, wherein the at least one second substrate pad is on a top surface of the first substrate.

8. The semiconductor package of claim 1, wherein the first and second side surfaces face each other.

9. The semiconductor package of claim 1, wherein at least one second chip pad is spaced apart from the at least one first chip pad.

10. The semiconductor package of claim 1, wherein the first side surface includes an edge of the at least one first semiconductor chip in the peripheral circuit region, and the second side surface includes an edge of the at least one first semiconductor chip in the cell region.

11. A semiconductor package comprising:
a first substrate including at least one first substrate pad and at least one second substrate pad spaced apart from each other;
at least one first semiconductor chip stacked on the first substrate and having a first side surface and a second side surface and including a cell region and a peripheral circuit region;
at least one first chip pad on the at least one first semiconductor chip, the at least one first chip pad being arranged adjacent to the first side surface, and on the at least one first substrate pad so as to be electrically connected to the at least one first substrate pad;
a second semiconductor chip adjacent to the second side surface and including at least one second chip pad and electrically connected to the at least one second substrate pad;
a heat transfer member provided to the first substrate between the at least one first chip and the at least one second substrate pad, wherein the at least one first semiconductor chip is a plurality of first semiconductor chips arranged in a stacked configuration, the at least one first chip pad on the at least one first semiconductor chip is a plurality of first chip pads on each of the plurality of first semiconductor chips, the at least one second chip pad is a plurality of second chip pads on the second semiconductor chip, the at least one first substrate pad is a plurality of first substrate pads, and the at least one second substrate pad is a plurality of second substrate pads, wherein the plurality of first substrate pads is electrically connected to the plurality of first chip pads and the plurality of second chip pads is electrically connected to the plurality of second substrate pads.

12. The semiconductor package of claim 11, wherein the plurality of second chip pads are electrically connected to the plurality of second substrate pads by one of a plurality of solder bumps and a plurality of wires.

13. The semiconductor package of claim 11, wherein at least one of the plurality of first semiconductor chips includes a CPU chip.

* * * * *